(12) United States Patent
Harada et al.

(10) Patent No.: US 10,950,566 B2
(45) Date of Patent: Mar. 16, 2021

(54) SEMICONDUCTOR DEVICE AND METHOD FOR MANUFACTURING THE SEMICONDUCTOR DEVICE

(71) Applicant: Mitsubishi Electric Corporation, Tokyo (JP)

(72) Inventors: Kenji Harada, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/440,466

(22) Filed: Jun. 13, 2019

(65) Prior Publication Data
US 2020/0013741 A1 Jan. 9, 2020

(30) Foreign Application Priority Data
Jul. 4, 2018 (JP) .............................. JP2018-127211

(51) Int. Cl.
*H01L 29/40* (2006.01)
*H01L 21/44* (2006.01)
*H01L 23/00* (2006.01)

(52) U.S. Cl.
CPC .............. *H01L 24/13* (2013.01); *H01L 24/11* (2013.01); *H01L 2224/13017* (2013.01); *H01L 2224/13083* (2013.01); *H01L 2924/014* (2013.01)

(58) Field of Classification Search
CPC ....................................................... H01L 24/13
USPC .................. 257/736, 779–781; 438/612–614
See application file for complete search history.

(56) References Cited

U.S. PATENT DOCUMENTS

| 6,683,375 B2 * | 1/2004 | Joshi ...................... H01L 24/11 257/690 |
| 7,679,197 B2 * | 3/2010 | Otremba ............... H01L 25/074 257/777 |
| 9,653,390 B2 | 5/2017 | Nakata et al. |

FOREIGN PATENT DOCUMENTS

| JP | S63-305532 A | 12/1988 |
| JP | 6156381 B2 | 7/2017 |

* cited by examiner

*Primary Examiner* — Calvin Lee
(74) *Attorney, Agent, or Firm* — Studebaker & Brackett PC

(57) ABSTRACT

Provided is a technique for improving the durability of a semiconductor device. A semiconductor device includes a semiconductor substrate, an electrode on the semiconductor substrate, a solder-joining metal Him on the electrode, an oxidation-inhibiting metal film on the solder-joining metal film, and a solder layer on the oxidation-inhibiting metal film. The solder-joining metal film includes a first portion that does not overlap the oxidation-inhibiting metal film in plan view when the solder-joining metal film and the oxidation-inhibiting metal film are viewed from the oxidation-inhibiting metal film.

17 Claims, 18 Drawing Sheets

F I G. 5
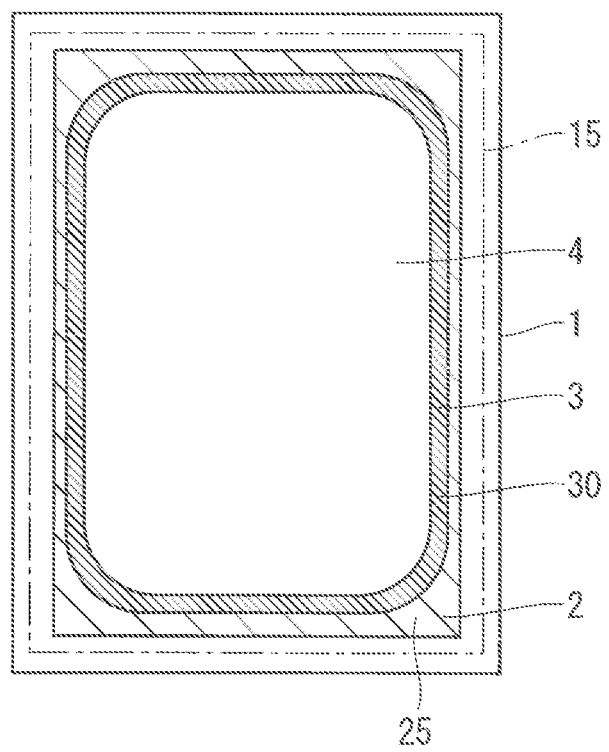

F I G. 9
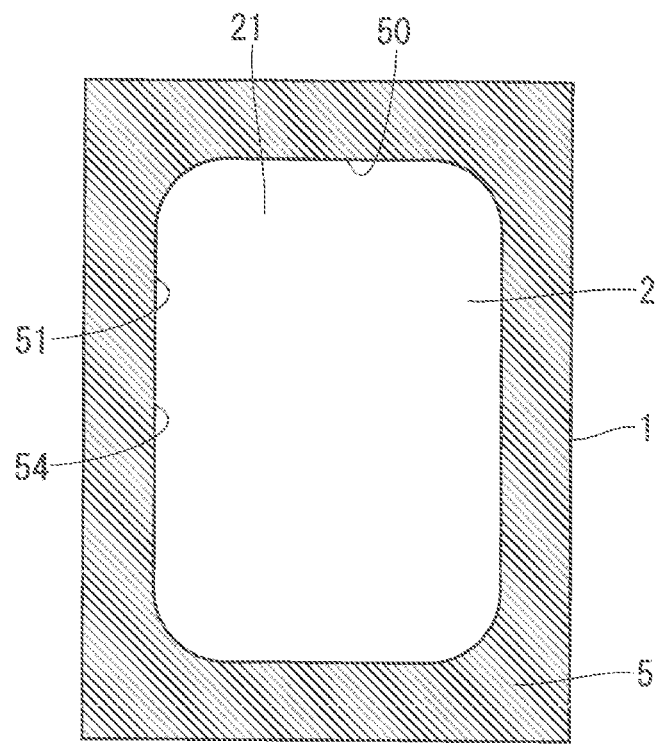
F I G. 10
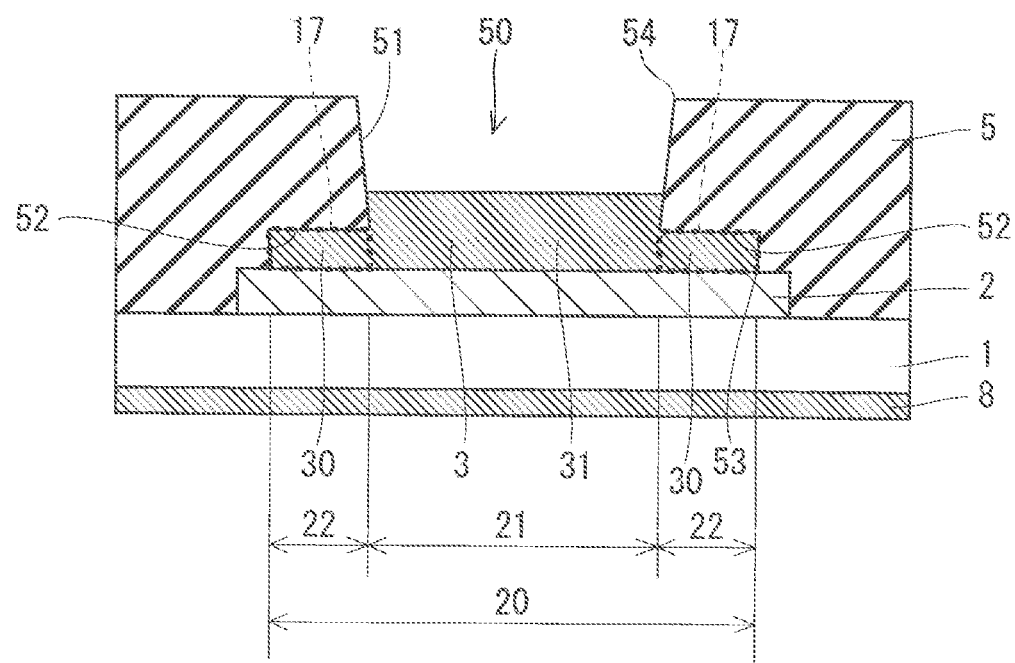

SEMICONDUCTOR DEVICE AND METHOD FOR MANUFACTURING THE SEMICONDUCTOR DEVICE

BACKGROUND OF THE INVENTION

Field of the Invention

The present invention relates to semiconductor devices.

Description of the Background Art

Japanese Patent No. 6156381 and Japanese Patent Application Laid-Open No. 63-305532 describe techniques about semiconductor devices.

Semiconductor devices need to be more durable.

SUMMARY

It is an object of the present invention to provide a technique for improving the durability of a semiconductor device.

One aspect provides a semiconductor device that includes a semiconductor substrate, an electrode on the semiconductor substrate, a solder-joining metal film on the electrode, an oxidation-inhibiting metal film on the solder-joining metal film, and a solder layer on the oxidation-inhibiting metal film. The solder-joining metal film includes a first portion that does not overlap the oxidation-inhibiting metal film in plan view when the solder-joining metal film and the oxidation-inhibiting metal film are viewed from die oxidation-inhibiting metal film.

Another aspect provides a method for manufacturing the semiconductor device. The method includes forming the solder-joining metal film through plating, and forming the oxidation-inhibiting metal film onto the solder-joining metal film through plating.

Still another aspect provides a method for manufacturing the semiconductor device. The semiconductor device further includes an insulating film that covers the first portion in plan view when the solder joining metal film and the oxidation-inhibiting metal film are viewed from the oxidation-inhibiting metal film. The method includes forming the solder-joining metal film, forming the oxidation-inhibiting metal film onto part of the upper surface of the solder joining metal film, and forming the insulating film by oxidizing a portion of the solder-joining metal film exposed from the oxidation-inhibiting metal film.

The durability of the semiconductor device improves.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 and 5 are plan views each illustrating one example of the structure of the semiconductor device;

FIG. 9 is a plan view illustrating the process step for manufacturing the semiconductor device;

FIG. 10 is a cross-sectional view illustrating a process step for manufacturing the semiconductor device;

DESCRIPTION OF THE PREFERRED EMBODIMENTS

First Preferred Embodiment

Figure 1:
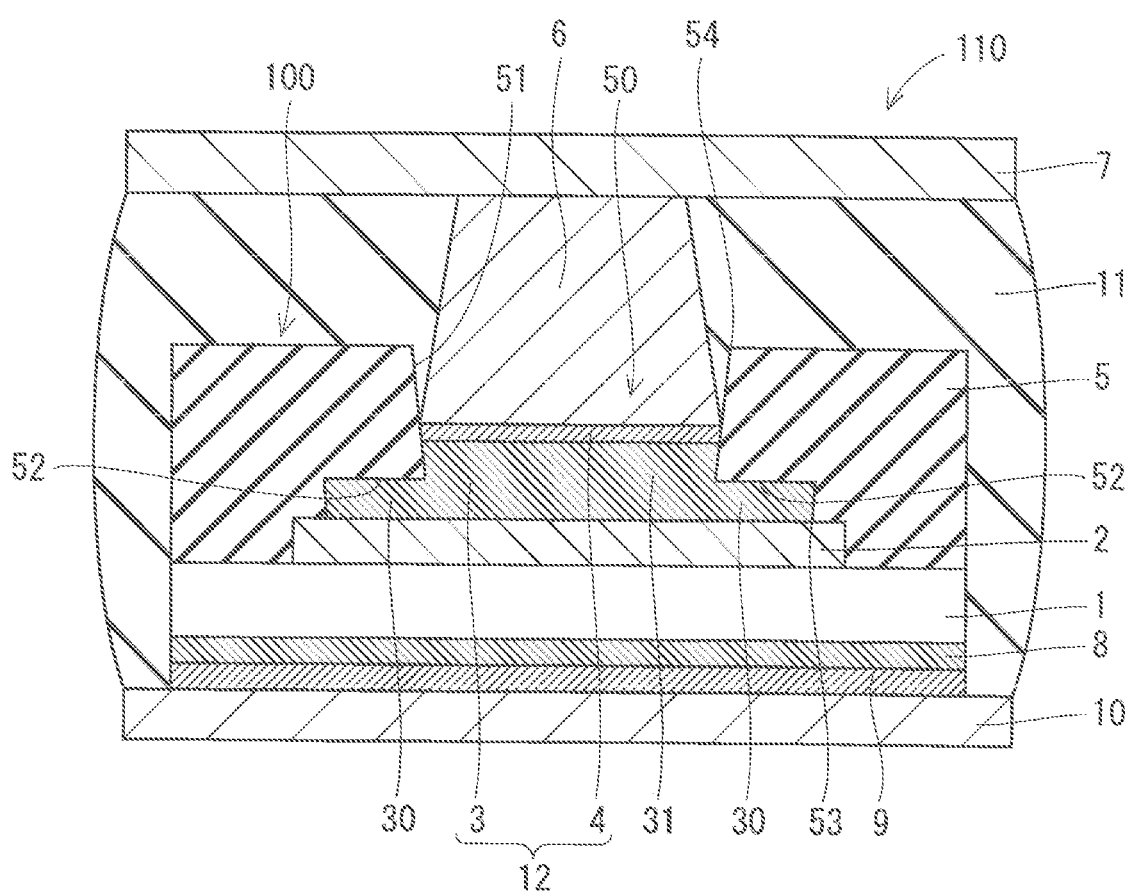
FIG. 1 is a cross-sectional view illustrating one example of the structure of a semiconductor device.

FIG. 1 is a cross-sectional view illustrating the structure of a semiconductor device 110 according to a first preferred embodiment. As illustrated in FIG. 1, the semiconductor device 110 includes the following: a semiconductor device 100 (e.g., a vertical diode); an electrode 7; a solder layer 6 for connection between the semiconductor device 100 and the electrode 7; a base plate 10 supporting the semiconductor device 100; a solder layer 9 for connection between the semiconductor device 100 and the base plate 10; and a sealant 11 sealing the semiconductor device 100 and the solder layers 6 and 9. The electrode 7 and the base plate 10 are made of, for instance, metal. The sealant 11 is made of, for instance, resin or gel. The solder layers 6 and 9 are made of, for instance, SnAgCu-based lead (Pb)-free solder.

Figure 2:
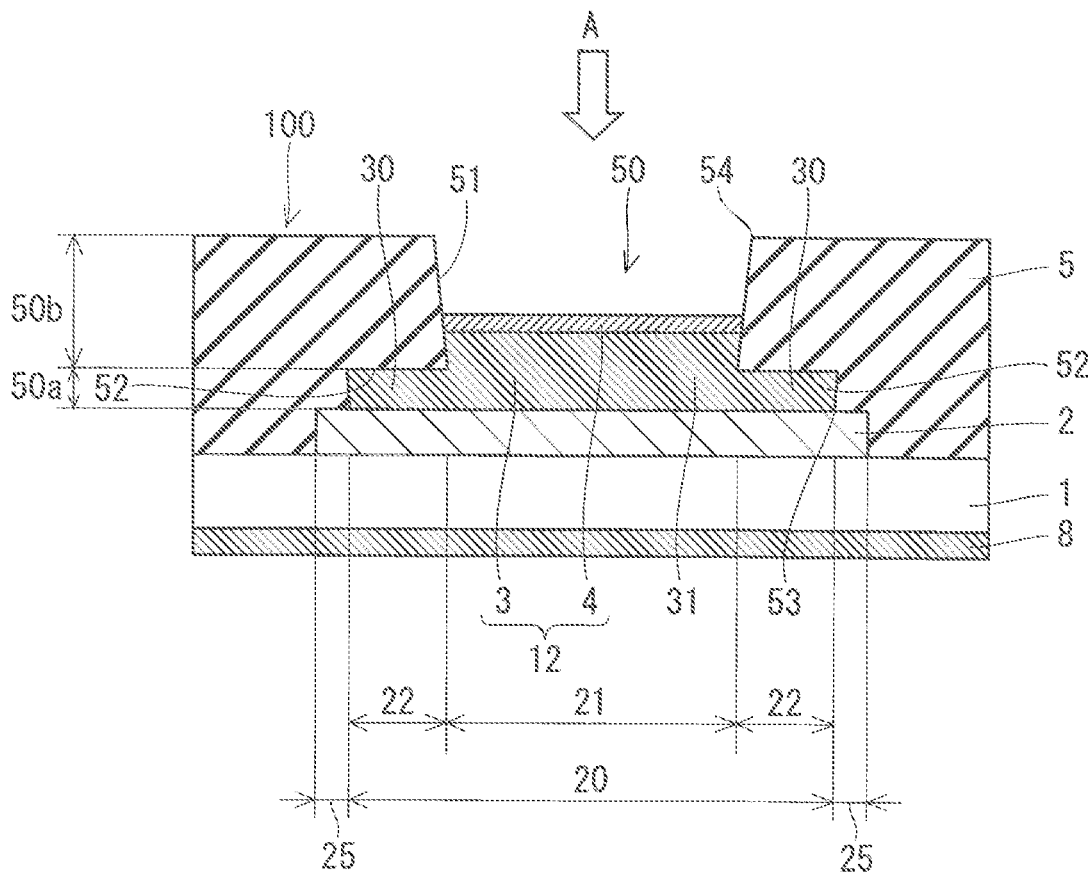
FIGS. 2 and 3 are cross-sectional views illustrating one example of the structure of a semiconductor device.
Figure 3:
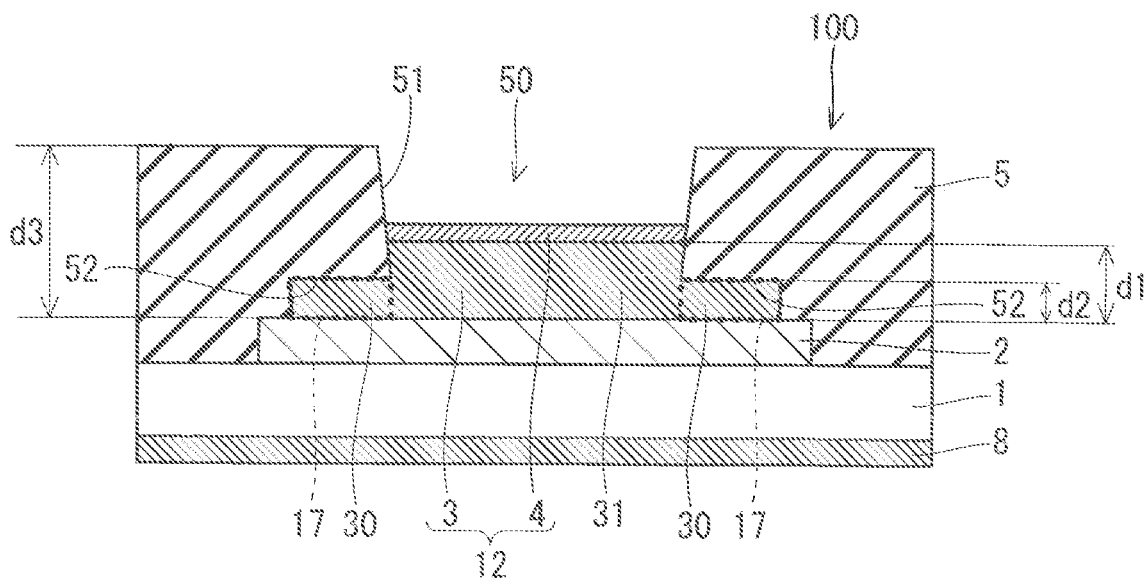
Figure 4:
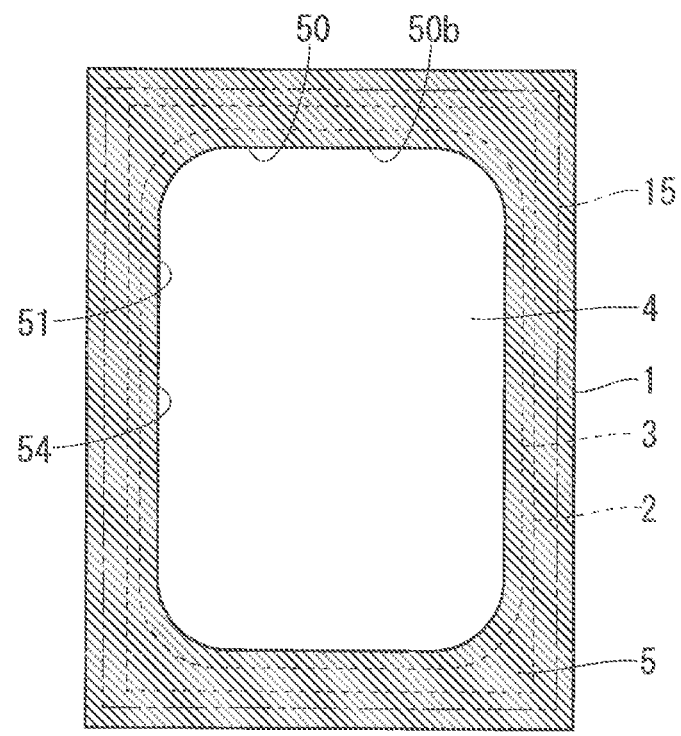

FIGS. 2 and 3 are cross-sectional views illustrating one example of the structure of the semiconductor device 100. FIGS. 2 and 3 show part of the structure illustrated in FIG. 1, and show the same structure. FIG. 4 is a plan view illustrating the structure in FIG. 2 when viewed from arrow A. FIG. 5 is a plan view illustrating the structure in FIG. 2 in which a protective film 5 is removed. This structure is viewed from arrow A.

As illustrated in FIGS. 1 to 5, the semiconductor device 100 includes a semiconductor substrate 1, an anode electrode 2, a metal film 12, a protective film 5, and a cathode electrode 8. The anode electrode 2 is disposed on the upper surface (i.e., a surface on which the elements are disposed) of the semiconductor substrate 1. The cathode electrode 8 is disposed on the hack surface of the semiconductor substrate 1. The cathode electrode 8 is attached to the base plate 10 via the solder layer 9.

The anode electrode 2 and the cathode electrode 8 are each made of metal. The anode electrode 2 is made of, for instance aluminum (Al). The anode electrode 2 may be made of an Al-based metal material. For instance, the anode electrode 2 may be made of a metal material containing equal to or more than 95% Al. The Al-based metal material facilitates, with existing methods, forming and processing of the anode electrode 2, which serves as electrodes of semiconductor elements on various semiconductor substrates such as a silicon substrate. The cathode electrode 8 may be made of a material identical to that of the anode electrode 2, or of a material different from that of the anode electrode 2.

The metal film 12 is disposed on the anode electrode 2. The metal film 12 is connected to the electrode 7 via the solder layer 6. The metal film 12 includes a solder-joining metal film 3 and an oxidation-inhibiting metal film 4. The solder-joining metal film 3 is disposed on the anode electrode 2. The oxidation-inhibiting metal film 4 is disposed on the solder-joining metal film 3. The solder layer 6 is disposed on the oxidation-inhibiting metal film 4. The metal film 12, is a laminated metal film consisting of the solder-joining metal film 3 and the oxidation-inhibiting metal film 4.

The solder-joining metal film 3 is a film for joining solder to the anode electrode 2, and is made of, for instance, nickel (Ni). It is difficult to join the anode electrode made of an Al-based material with, for instance, SnAgCn-based Pb-free solder. Accordingly, depositing the solder-joining metal film 3 of Ni onto the anode electrode 2 improves the joining between the anode electrode 2 and the solder layer 6.

The oxidation-inhibiting metal film 4 is a film for inhibiting the surface oxidation of the solder-joining metal film 3, and is made of, for instance, gold (Au). The surface oxidation of the solder-joining metal film 3 degrades solderability; hence, the oxidation-inhibiting metal film 4 is deposited on the solder-joining metal film 3. The oxidation-inhibiting metal film 4 may be made of a material other than Au. For instance, the oxidation-inhibiting metal film 4 may be made of silver (Ag).

As described above, the metal film 12, consisting of the Ni and Au films for high adhesion with the anode electrode 2, is provided in this example in order to deposit the solder layer 6 onto the anode electrode 2. It is noted that the metal film 12 may be a laminated metal film consisting of three or more layers including a film other than the solder-joining metal film 3 and the oxidation-inhibiting metal film 4.

The protective film 5 is disposed on the semiconductor substrate 1 and the anode electrode 5. The protective film 5 is an insulating film and is made of an electrically insulating material, such as polyimide resin. The protective film 5 has an opening 50 extending through in the thickness direction of the protective film 5. The opening 50 partly exposes the anode electrode 2. The opening 50 includes a first opening-edge 53 adjacent to the anode electrode 2, and a second opening-edge 54 opposite to the first opening-edge 53. The anode electrode 2 has an exposed portion 20. This exposed portion 20 is a portion except a perimeter 25 of the anode electrode 2, and is exposed from the opening 50. The solder-joining metal film 3 is disposed on the exposed portion 20 of the anode electrode 2. The solder-joining metal film 3 and the oxidation-inhibiting metal film 4 are located in the opening 50.

The opening 50 in this example has an inner wall 51 having a reverse stair shape. The inner wall 51 in this example has a reverse stair shape having a single stair. The inner wall 51 thus has one stair 52. The stair 52 is also referred to as an cave.

As illustrated in FIG. 2, the exposed portion 20 of the solder-joining metal film 3 has a first portion 21 and a second portion 22. The first portion 21, when viewed from the second opening-edge 54, does not overlap the protective film 5 in plan view. The second portion 22, when viewed from the second opening-edge 54, overlaps the protective film 5 in plan view. The solder-joining metal film 3 is located on the first portion 21 and the second portion 22.

As illustrated in FIG. 5, the area of the soldering metal film 3 is greater than the area of the oxidation-inhibiting metal film 4 in plan view when the soldering metal film 3 and the oxidation-inhibiting metal film 4 are viewed from the oxidation-inhibiting metal film 4. The solder-joining metal film 3 has a first portion 30 and a second portion 31. The first portion 30 does not overlap the oxidation-inhibiting metal film 4 in plan view when the solder-joining metal film 3 and the oxidation-inhibiting metal film 4 are viewed from the oxidation-inhibiting metal film 4. The second portion 31 overlaps the oxidation-inhibiting metal film 4 in plan view when the solder-joining metal film 3 and the oxidation-inhibiting metal film 4 are viewed from the oxidation-inhibiting metal film 4.

As illustrated in FIG. 2, the opening 50, which has the reverse-stair-shaped inner wall 51, includes a first opening 50a of large diameter, and a second opening 50b of small diameter communicating with the first opening 50a. The first opening 50a exposes the anode electrode 2. The second opening 50b is located above the first opening 50a.

The soldering metal film 3 fills the entire first opening 50a. Thus, a region 17 under the stair 52 (c.f., FIG. 3) and between die stair 52 and the anode electrode 2 is filled with the soldering metal film 3. In the soldering metal film 3, a portion filling the region 17 is the first portion 30, and the remaining portion is the second portion 31. That is, the first portion 30, filling the region 17, is covered with the stair 52. The first portion 30 is the perimeter of the solder-joining metal film 3. Thus, the perimeter of die solder-joining metal film 3 is covered with the protective film 5. The region 17 is hereinafter referred to as a lower region 17.

As illustrated in FIG. 3, the second portion 31 of the solder-joining metal film 3 (i.e., a portion other than the first portion 30 filling the lower region 17) has a thickness d1 greater than a height d2 of the stair 52 (i.e., an eave) measured from the anode electrode 2. In addition, the thickness d1 is smaller than a thickness d3 of the protective film 5 above the anode electrode 2. Thus, the second portion 31 of the solder-joining metal film 3 fills not only die first opening 50a, but also the lower end of the second opening 50b. The oxidation-inhibiting metal film 4 is disposed on the second portion 31. The oxidation-inhibiting metal film 4 is located in the second opening 50b. The thickness d1 is set to be, for instance, 1 μm or more. This thickness enables sufficient protection of the anode electrode 2 during soldering.

As illustrated in FIG. 4, which illustrates the semiconductor device 100 when viewed from arrow A in FIG. 2, only the protective film 5 and the oxidation-inhibiting metal film 4 in the opening 50 of the protective film 5 are seen. In other words, only the protective film 5 and the oxidation-inhibiting metal film 4 of the semiconductor device 100 are seen in plan view when viewed from the second opening-edge 54 of the opening 50.

As illustrated in FIG. 5, the area of the anode electrode 2 is greater, in plan view, than the area of the solder-joining metal film 3 and of the oxidation-inhibiting metal film 4 when the anode electrode 2, the soldering metal film 3, and the oxidation-inhibiting metal film 4 are viewed from the oxidation-inhibiting metal film 4. The anode electrode 2 has a portion that does not overlap the solder-joining metal film 3 and the oxidation-inhibiting metal film 4 in plan view when the anode electrode 2, the solder-joining metal film 3, and the oxidation-inhibiting metal film 4 are viewed from the oxidation-inhibiting metal film 4. This portion is the perimeter 25 of the anode electrode 2, which is not exposed from the opening 50. As illustrated in FIGS. 4 and 5 the semiconductor device 100 has a termination region 15 outside the anode electrode 2.

As described above, the solder-joining metal film 3 in this example has the first portion 30 that does not overlap the oxidation-inhibiting metal film 4 in plan view when the solder-joining metal film 3 and the oxidation-inhibiting metal film 4 are viewed from the oxidation-inhibiting metal film 4. Accordingly, the solder layer 6, when formed on the oxidation-inhibiting metal film 4, is not located above the perimeter of the solder-joining metal film 3. Consequently, the durability of the semiconductor device 110 improves. The following details this point.

Figure 6:
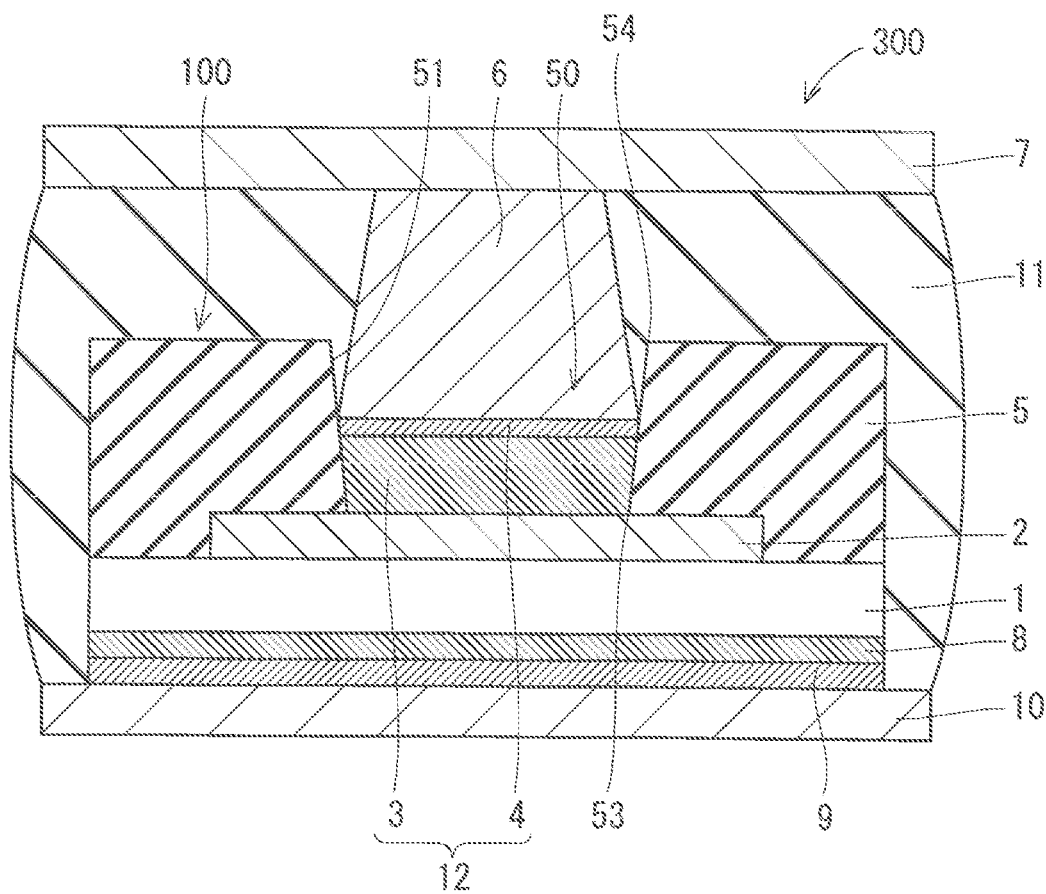
FIG. 6 is a cross-sectional view illustrating one example of the structure of a comparative device.

FIG. 6 is a cross-sectional view illustrating the structure of a comparative device 300 that is used to be compared with the semiconductor device 110 according to the preferred embodiment. The protective film 5 in the comparative device 300 has the opening 50 whose inner wall 51 is not in the shape of a reverse stair, but is tapered in such a manner that its diameter decreases a little, from the second opening-edge 54 toward the first opening-edge 53.

The oxidation-inhibiting metal film 4 of the comparative device 300 is disposed all across the upper surface of the solder-joining metal film 3. Titus, the solder-joining metal film 3 in whole overlaps the oxidation-inhibiting metal film 4 in plan view when the solder-joining metal film 3 and the oxidation-inhibiting metal film 4 are viewed from the oxidation-inhibiting metal film 4. Accordingly, the solder layer 6, when formed on the oxidation-inhibiting metal film 4, is located all over the solder-joining metal film 3. Hence, under a thermal stress resulting from a heat cycle test and other things, the comparative device 300 receives a large stress between tire solder-joining metal film 3 and the solder layer 6 due to their difference in thermal expansion coefficient. Consequently, the anode electrode 2 can have cracks, or can be detached from the semiconductor substrate 1. In the comparative device 300, the stress between the solder-joining metal film 3 and the solder layer 6 lifts up the entire solder-joining metal film 3, thus possibly causing cracks in the anode electrode 2 or possibly detaching the anode electrode 2 from the semiconductor substrate 1.

In contrast, the preferred embodiment, in which the solder layer 6 is not located above the perimeter of the solder-joining metal film 3, enables the anode electrode 2 to be less affected by a stress resulting from the difference in thermal expansion coefficient between the solder-joining metal film 3 and the solder layer 6. A thermal stress, if applied to the semiconductor device 110, produces a stress that ruptures the solder-joining metal film 3. The anode electrode 2 of the semiconductor device 110 less receives a stress than the anode electrode 2 of the comparative device 300. This reduces the possibility of cracking in the anode electrode 2 or the detachment of the anode electrode 2 from the semiconductor substrate 1. Consequently, the durability of the semiconductor device 110 improves.

The protective film 5 in the preferred embodiment has the opening 50 whose inner wall 51 has a reverse stair shape. This facilitates covering of the first portion 30 of the solder-joining metal film 3 with the protective film 5.

The semiconductor device 100 and the solder layer 6 in the preferred embodiment are sealed with the sealant 11. Thus, the solder-joining metal film 3 and the solder layer 6 are fastened using the sealant 11. This reduces possible deformation of the solder-joining metal film 3 and the solder layer 6, thereby further reducing the possibility of cracking in the anode electrode 2 or the detachment of the anode electrode 2. It is noted that the sealant 11 may be any material that can fasten the semiconductor device 100 and the solder layer 6 from outside, other than resin and gel.

Figure 7:
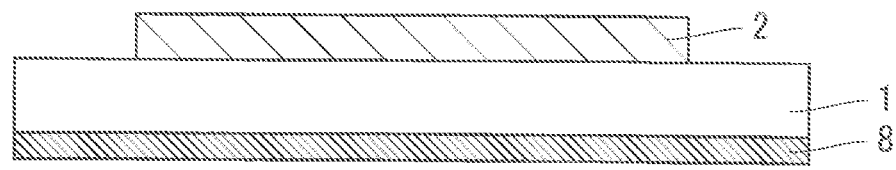
FIGS. 7 and 8 are cross-sectional views illustrating process steps for manufacturing the semiconductor device.
Figure 8:
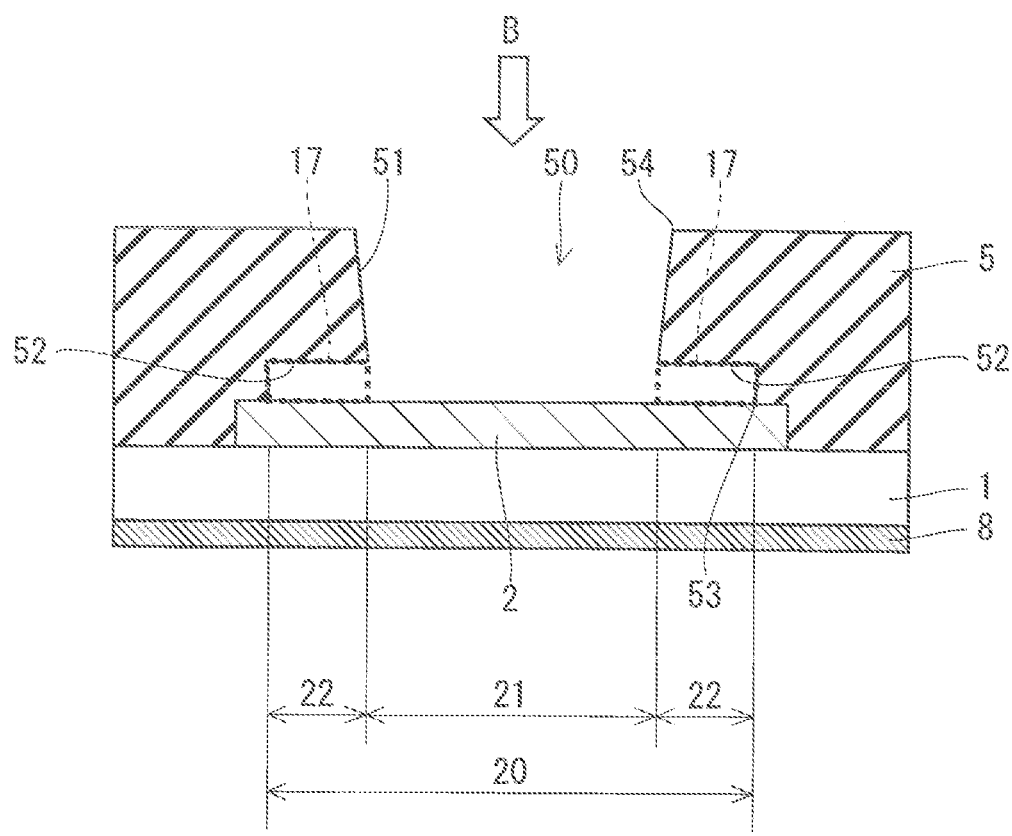

The following describes one example of a method for manufacturing the semiconductor device 110. FIGS. 7, 8 and 10 are cross-sectional views each illustrating one example of a process step for manufacturing the semiconductor device 110. FIG. 9 is a plan view illustrating one example of the process step for manufacturing the semiconductor device 110.

First, as illustrated in FIG. 7, the semiconductor substrate 1 is prepared that has one main surface provided with the anode electrode 2, and the other main surface provided with the cathode electrode 8. The semiconductor substrate 1 provided with the anode electrode 2 and the cathode electrode 8 is prepared in a wafer-related process. The anode electrode 2 and the cathode electrode 8 are formed through, for instance, physical vapor deposition (PVD). The anode electrode 2 and the cathode electrode 8 may be made formed through sputtering or vapor deposition.

Next, as illustrated in FIG. 8, the protective film 5 having the aforementioned opening 50 is formed onto the semiconductor substrate 1 and the anode electrode 2. FIG. 9 is a plan view illustrating the structure in FIG. 8 when viewed from arrow B. As illustrated in FIGS. 8 and 9, the protective film 5 is formed in such a manner that the exposed portion 20 of the anode electrode 2, exposed from the opening 50, has the first portion 21 that does not overlap the protective film 5 in plan view when viewed from the second opening-edge 54, and has the second portion 22 that overlaps the protective film 5 in plan view when viewed from the second opening-edge 54. The protective film 5 is formed in such a manner that the inner wall 51 of the opening 50, when having a reverse stair shape, has the stair 52 that faces the second portion 22 of the anode electrode 2 with a gap interposed between the stair 52 and the second portion 22. Just after the protective film 5 is formed, the lower region 17 under the stair 52 is a gap.

The protective film 5 may be formed using an insulating film of photosensitive polyimide. In this case, the protective film 5 is formed through the following schematic steps. The first step is applying the insulating film of photosensitive polyimide onto the structure illustrated in FIG. 7 through, for instance, spin coating. The subsequent step is patterning the insulating film through exposure and development. Patterning the insulating film of photosensitive polyimide forms die protective film 5 of photosensitive polyimide. In this way, the patterning for forming the protective film 5 can be performed through photolithography.

Alternatively, the protective film 5 may be formed using an insulating film of non-photosensitive polyimide. In this case, the protective film 5 is formed through the following schematic steps. The first step is applying the insulating film of non-photosensitive polyimide onto the structure illustrated in FIG. 7 through, for instance, spin coating. The next step is applying a photoresist onto the insulating film. The subsequent step is patterning the photoresist through exposure and development. The next step is patterning the insulating film of non-photosensitive polyimide through etching using, as a mask, the photoresist that has undergone patterning. Patterning the insulating film of non-photosensitive polyimide forms the protective film 5 of non-photosensitive polyimide. How to form the protective film 5 will be detailed later on.

Next, as illustrated in FIG. 10, the solder-joining metal film 3 is formed through, for instance, plating. Here, the solder-joining mewl film 3 of Ni is formed onto the exposed portion 20 of the anode electrode 2 through, for instance, electroless plating including a zincate process.

Such a plating method easily forms the solder-joining metal film 3 having a shape that fits the shape of the inner wall 51 of the opening 50. Consequently, the lower region 17, that is, the gap between the stair 52 and the anode electrode 2, is easily filled with the solder-joining metal film 3. In other words, the perimeter of the solder-joining metal film 3 is easily covered with the protective film 5. The solder-joining metal film 3 includes the first portion 30 that is covered with the protective film 5 in plan view when viewed from second opening-edge 54, and includes the second portion 31 that is not covered with the protective film 5 in plan view when viewed from the second opening-edge 54.

Next, the oxidation-inhibiting metal film 4 is formed onto the second portion 31 of the solder-joining metal film 3 exposed from the opening 50 through, for instance, plating. This obtains the semiconductor device 100 illustrated in FIG. 2. Like the formation of the solder-joining metal film 3, a plating method easily forms the oxidation-inhibiting metal film 4 onto only the second portion 31 of the solder-joining metal film 3. Since the lower region 17 is filled with the solder-joining metal film 3, the oxidation-inhibiting metal film 4 is not formed in the lower region 17.

After the semiconductor device 100 is completed, the oxidation-inhibiting metal film 4 is soldered to the electrode 7. Accordingly, the oxidation-inhibiting metal film 4 is attached to the electrode 7 via the solder layer 6. Further, the cathode electrode 8 is soldered to the base plate 10. Accordingly, the cathode electrode 8 is attached to the base plate 10 via the solder layer 9. The sealant 11 is placed afterwards. This completes the semiconductor device 110 illustrated in FIG. 1.

As described above, the solder-joining metal film 3 and the oxidation-inhibiting metal film 4 in the preferred embodiment are formed through plating. This easily forms the solder-joining metal film 3 and the oxidation-inhibiting metal film 4.

The solder-joining metal film 3 and the oxidation-inhibiting metal film 4 in the preferred embodiment are formed in the opening 50 of the protective film 5 through plating. As such, changing the shape of the inner wall 51 of the opening 50 facilitates shape changing of the solder-joining metal film 3 and the oxidation-inhibiting metal film 4.

As illustrated in FIGS. 8 and 9, the protective film 5 in the preferred embodiment is formed in such a manner that the exposed portion 20 of the anode electrode 2, exposed from the opening 50, has the first portion 21 that does not overlap the protective film 5 in plan view when viewed from the second opening-edge 54 of the opening 50, and has the second portion 22 that overlaps the protective film 5 in plan view when viewed from the second opening-edge 54 of the opening 50. As such, changing the shape of the second portion 22, which overlaps the protective film 5 in plan view when viewed from the second opening-edge 54, facilitates shape changing of the first portion 30 of the solder-joining metal film 3 covered with the protective film 5.

The protective film 5 in the preferred embodiment is formed in such a manner that the inner wall 51 of the opening 50 has a reverse stair shape having the stair 52 that faces the second portion 22 with a gap interposed between the stair 52 and the second portion 22. As such, changing the shape of the gap between the stair 52 and the second portion 22 facilitates shape changing of the first portion 30 of the solder-joining metal film 3, covered with the protective film 5.

Figure 11:
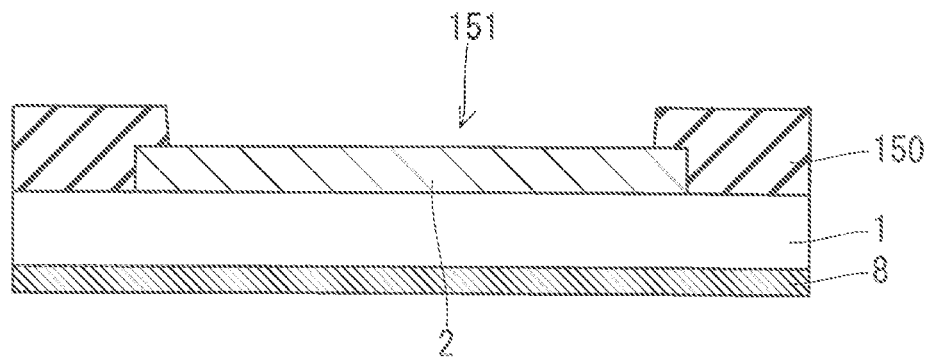
FIGS. 11 and 12 are cross-sectional views illustrating process steps for manufacturing the semiconductor device.
Figure 12:
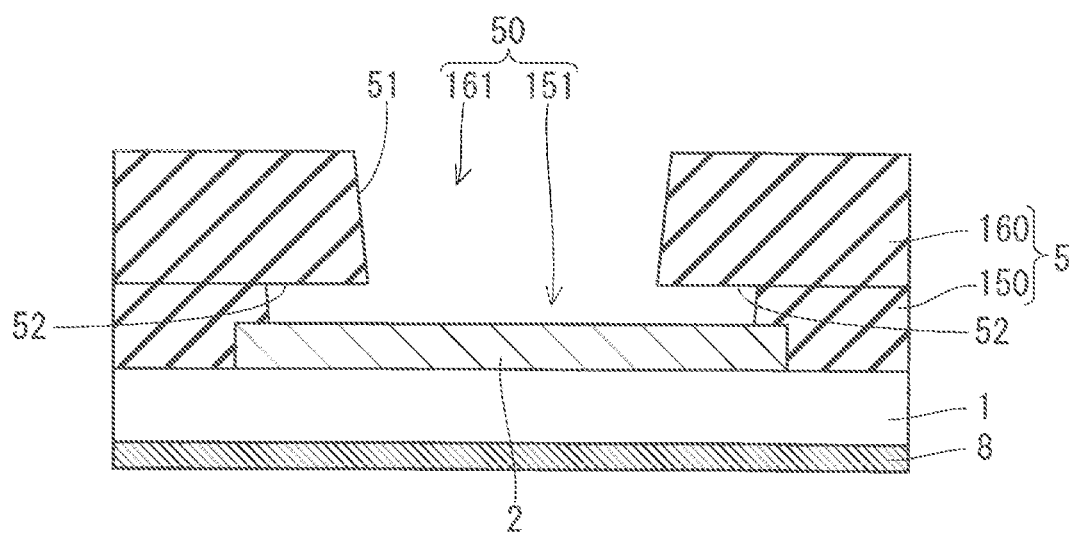

The following describes a specific example of how to form the protective film 5. FIGS. 11 and 12 are cross-sectional views illustrating one example of how to form the protective film 5. As illustrated in FIG. 11, an insulating film 150 having an opening 151 is formed onto the semiconductor substrate 1 and the anode electrode 2 after the structure in FIG. 7 is obtained. The opening 151 corresponds to the first opening 50a (c.f., FIG. 2). The insulating film 150 with the opening 151 can be formed through, for instance, photolithography.

Next, as illustrated in FIG. 12, an insulating film having an opening 161 is formed onto the insulating film 150. The insulating film 160 is made of the same material as the insulating film 150. The opening 161 corresponds to the second opening 50b (c.f., FIG. 2). The insulating film 160 with the opening 161 can be formed through, for instance, photolithography. Accordingly, the protective film 5 consisting of the insulating films 150 and 160 is formed on the semiconductor substrate 1 and the anode electrode 2. The opening 50 of the protective film 5 consists of the opening 151 of the insulating film 150 and the opening 161 of the insulating film 160.

In this way, depositing films of the same material a plurality of times easily forms the protective film 5 having the opening 50 whose inner wall 51 has a reverse stair shape.

Figure 13:
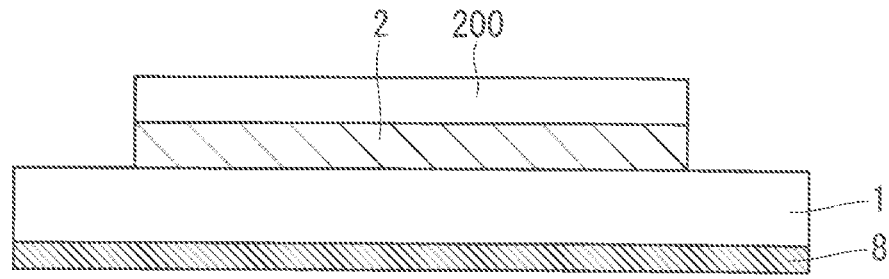
FIGS. 13 to 17 are cross sectional views illustrating process steps for manufacturing the semiconductor device.
Figure 14:
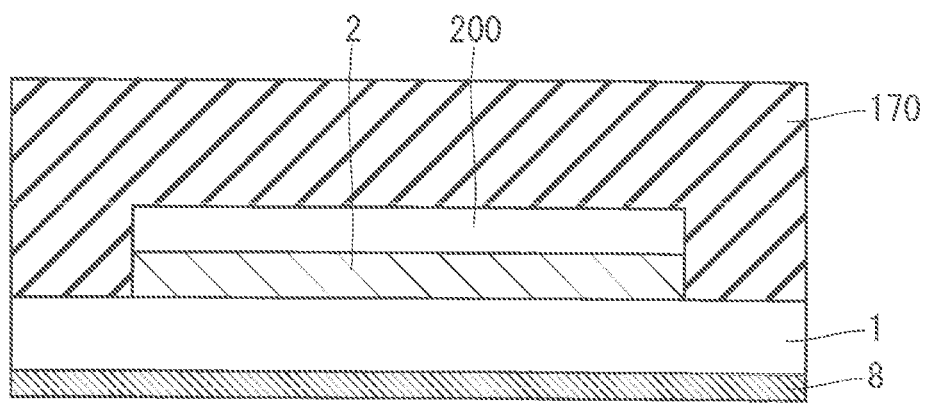
Figure 15:
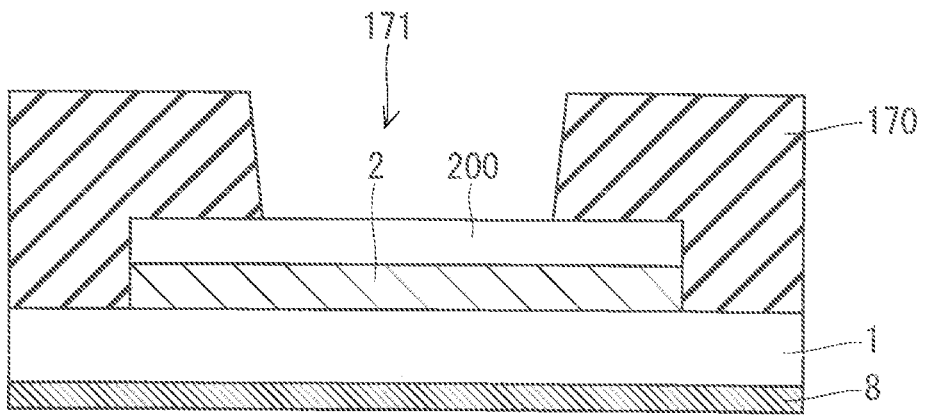

FIGS. 13 to 16 are cross-sectional views illustrating another example of how to form the protective film 5. As illustrated in FIG. 13, a film 200 is formed onto the anode electrode 2 after the structure in FIG. 7 is obtained. The film 200 is a metal film made of a metal material different from the metal material of the anode electrode 2. Next, as illustrated in FIG. 14, an insulating film 170 to be the protective film 5 is formed onto the structure illustrated in FIG. 13. Next, as illustrated in FIG. 15, the insulating film 170 is partly removed to form, in the insulating film 170, an opening 171 that partly exposes the upper surface of the anode electrode 2. The opening 171 corresponds to the second opening 50b. The insulating film 170, when made of photosensitive polyimide, undergoes exposure and development to form the opening 171 in the insulating film 170. Meanwhile, the insulating film 170, when made of non-photosensitive can undergo etching to form the opening 171 in the insulating film 170.

Figure 16:
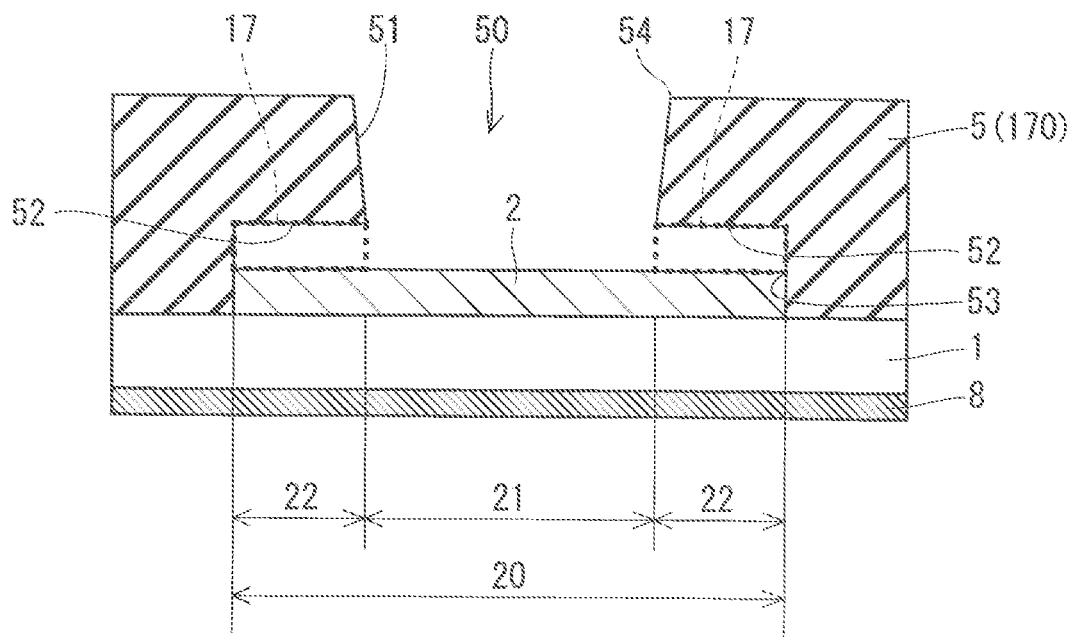
Figure 17:
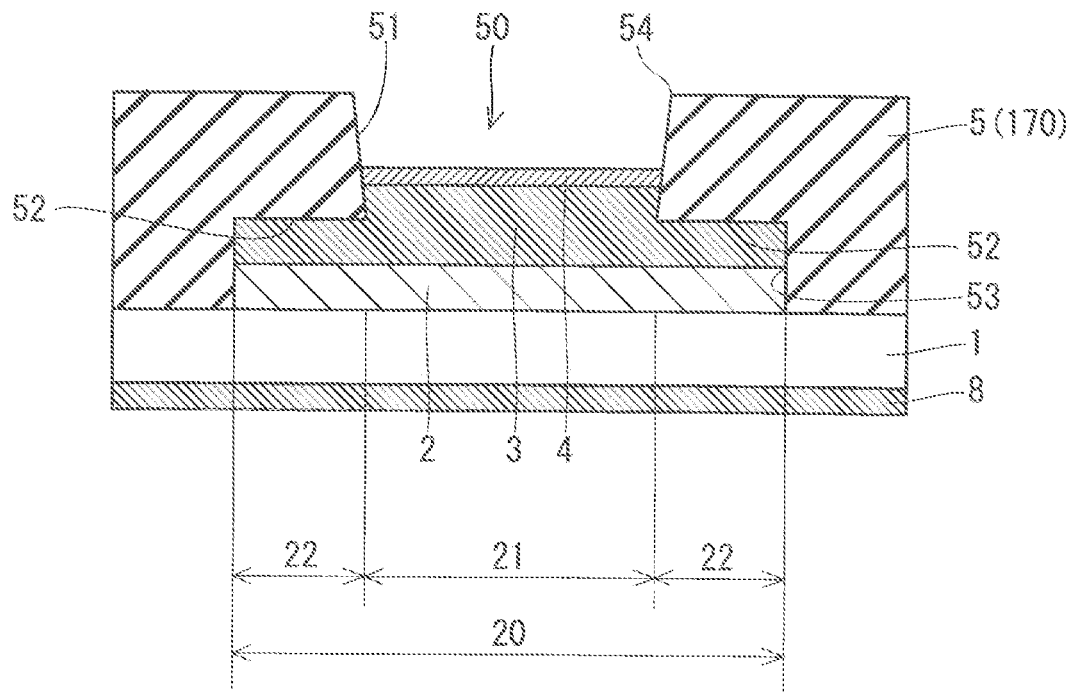

Next, the film 200 is removed through, for instance, isotropic wet etching. This forms the protective film 5 having the opening 50 on the semiconductor substrate 1 and the anode electrode 2, as illustrated in FIG. 16. The film 200 is a film for forming the lower region 17, which is the gap between the protective film 5 and the anode electrode 2. Forming the solder-joining metal film 3 and the oxidation-inhibiting metal film 4 onto the structure illustrated in FIG. 16 provides a structure illustrated in FIG. 17.

In this way, using the film 200 on the anode electrode 2 easily forms the protective film 5 having the opening 50 whose inner wall 51 has in a reverse stair shape. The film 200, when made of a metal material different from the metal material of the anode electrode 2, can undergo, for removal, an etching process having high selectivity with respect to the anode electrode 2.

Using isotropic wet etching to remove the film 200, as described in this example, properly removes a portion of the film 200 sandwiched between the insulating film 170 and the anode electrode 2.

It is noted that the film 200 may be an oxide film. In this case, the film 200 can undergo, for removal, an etching process having high selectivity with respect to the anode electrode 2. Oxidizing the upper surface of the anode electrode 2 after obtaining the structure illustrated in FIG. 7 forms, on the anode electrode 2, the film 200 consisting of an oxide of the same material as the anode electrode 2.

Figure 18:
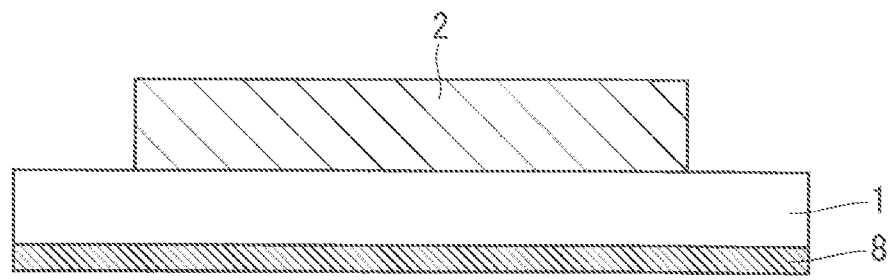
FIGS. 18 to 20 are cross sectional views illustrating process steps for manufacturing the semiconductor device.
Figure 19:
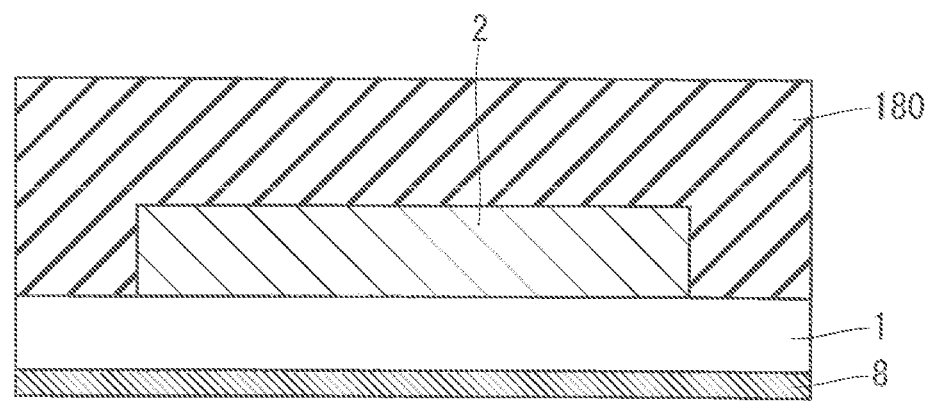
Figure 20:
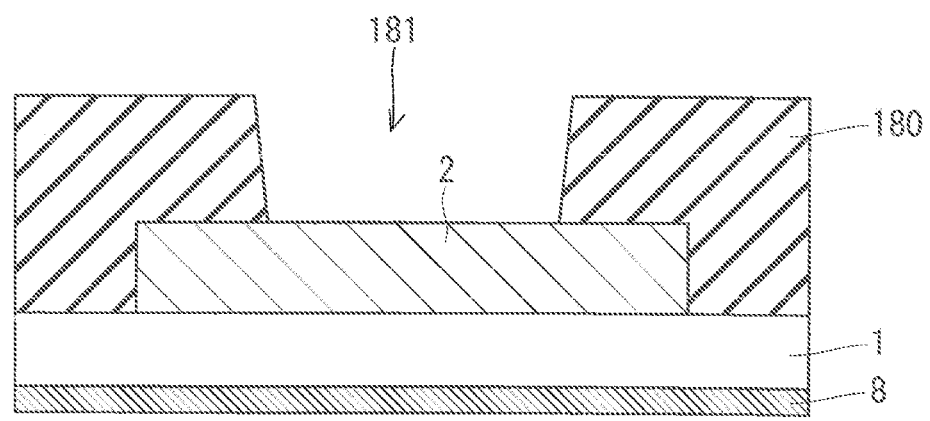

FIGS. 18 to 20 are cross-sectional views illustrating another example of how to form the protective film 5. As illustrated in FIG. 18, the anode electrode 2 in this example is formed to be thick. Next, as illustrated in FIG. 19, an insulating film 180 to be the protective film 5 is formed onto the structure illustrated in FIG. 18. Next, as illustrated in FIG. 20, the insulating film 180 is partly removed to form, in the insulating film 180, an opening 181 that partly exposes the upper surface of the anode electrode 2. The opening 181 corresponds to the second opening 50b. The opening 181 is formed in a manner similar to that in the opening 171. Next, the anode electrode 2 undergoes, for instance, isotropic wet etching to partly remove its upper surface, thus reducing the thickness of the anode electrode 2. This obtains a structure similar to the structure illustrated in FIG. 16. After that, the solder-joining metal film 3 and the oxidation-inhibiting metal film 4 are formed through plating. This obtains a structure similar to the structure illustrated in FIG. 17.

In this way, partly removing the thick anode electrode 2, thus forming a gap between the insulating film 170 and the anode electrode 2 eliminates the need for a process step of forming the film 200. This simplifies the process steps for manufacturing the semiconductor device 110.

Using isotropic wet etching to partly remove the anode electrode 2, as described in this example, properly forms a gap between the insulating film 170 and the anode electrode 2.

In partly removing the anode electrode 2 to form a gap between the anode electrode 2 and the protective film 5, an etchant identical to that used in patterning for forming the anode electrode 2 onto the semiconductor substrate 1.

It is noted that how to form the solder-joining metal film 3 and the oxidation-inhibiting metal film 4 is not limited to the foregoing examples. For instance, the solder-joining metal film 3 and the oxidation-inhibiting metal film 4 may be formed without the protective film 5 being formed. In one example, the solder-joining metal film 3 and the oxidation-inhibiting metal film 4 of the same shape as that described above may be formed by forming a metal film through vapor deposition or sputtering using a metal mask. In another example, the solder-joining metal film 3 and the oxidation-inhibiting metal film 4 of the same shape as that described above may be formed by forming a metal film through plating, sputtering, or vapor deposition, followed by patterning the metal film through photolithography. These examples eliminate the need for a process step of forming the protective film 5.

The inner wall 51 of the opening 50 of the protective film 5, although having a reverse stair shape having a single stair in the above example, may have a reverse stair shape having a plurality of stairs. That is, the inner wall 51 may have a reverse stair shape having a plurality of stairs 52.

Figure 21:
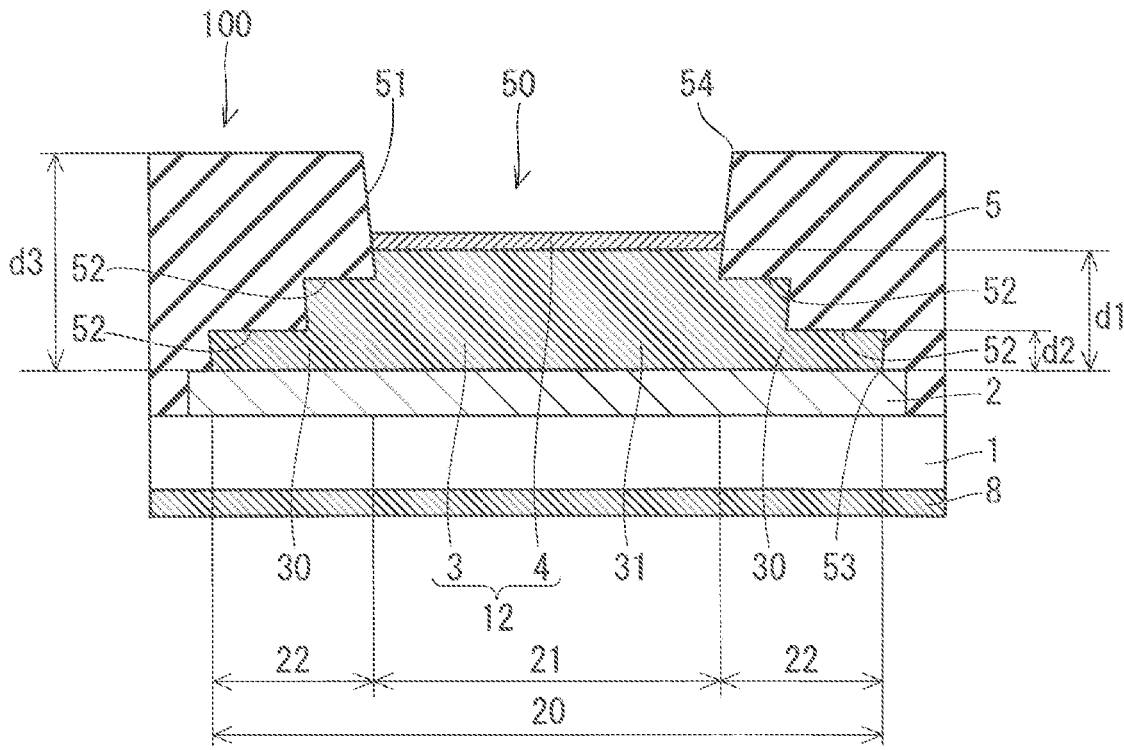
FIGS. 21 and 22 are cross-sectional views each illustrating one example of the structure of the semiconductor device.
Figure 22:
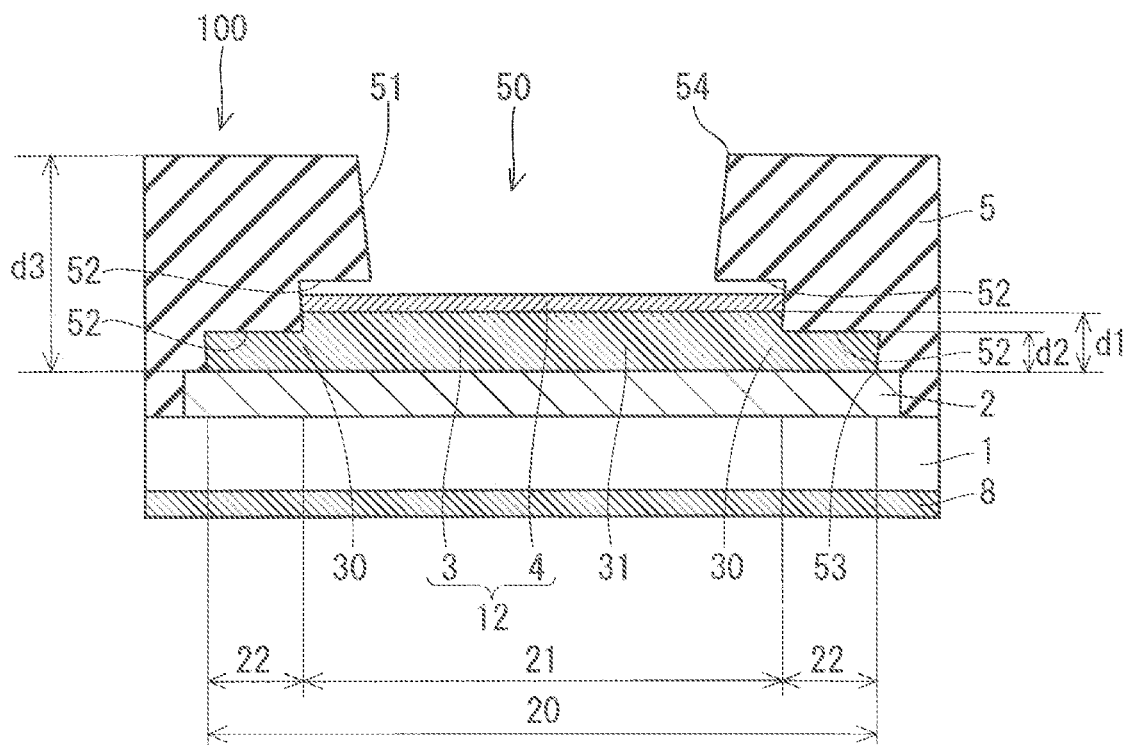

FIGS. 21 and 22 are cross-sectional views each illustrating one example of the structure of the semiconductor device 100 that includes the protective film 5 having the opening 50 whose inner wall 51 has a reverse stair shape having two stairs. In the examples of FIGS. 21 and 22, the inner wall 51 of the opening 50 has two stairs 52. In the example of FIG. 21, the spaces between the two stairs 52 and the anode electrode 2 are entirely filled with the solder-joining metal film 3. In the example of FIG. 22, the space between the lower stair 52 and the anode electrode 2 is entirely filled with the solder-joining metal film 3, and the space between the upper stair 52 and the anode electrode 2 is partly filled with the solder-joining metal film 3. In addition, the oxidation-inhibiting metal film 4 extends also under the upper stair 52.

When the inner wall 51 of the opening 50 has the stairs 52, as illustrated in FIGS. 21 and 22, the solder-joining metal film 3 needs to be formed in such a manner that the thickness d1 of the second portion 31, which does not overlap the protective film 5 in plan view when viewed from the second opening-edge 54, is greater than the height d2 of the lowest stair 52 measured from the anode electrode 2, and is smaller than the thickness d3 of the protective film 5 above the anode electrode 2. Accordingly, the space between the lowest stair 52 and the anode electrode 2 is entirely filled with the solder-joining metal film 3, regardless of the number of stairs 52 included in the inner wall 51 of the opening 50. Such a structure achieves an effect similar to that achieved by the structure illustrated in FIG. 2. It is noted that the inner wall 51 of the opening 50 may have a reverse stair shape having three or more stairs.

Second Preferred Embodiment

Figure 23:
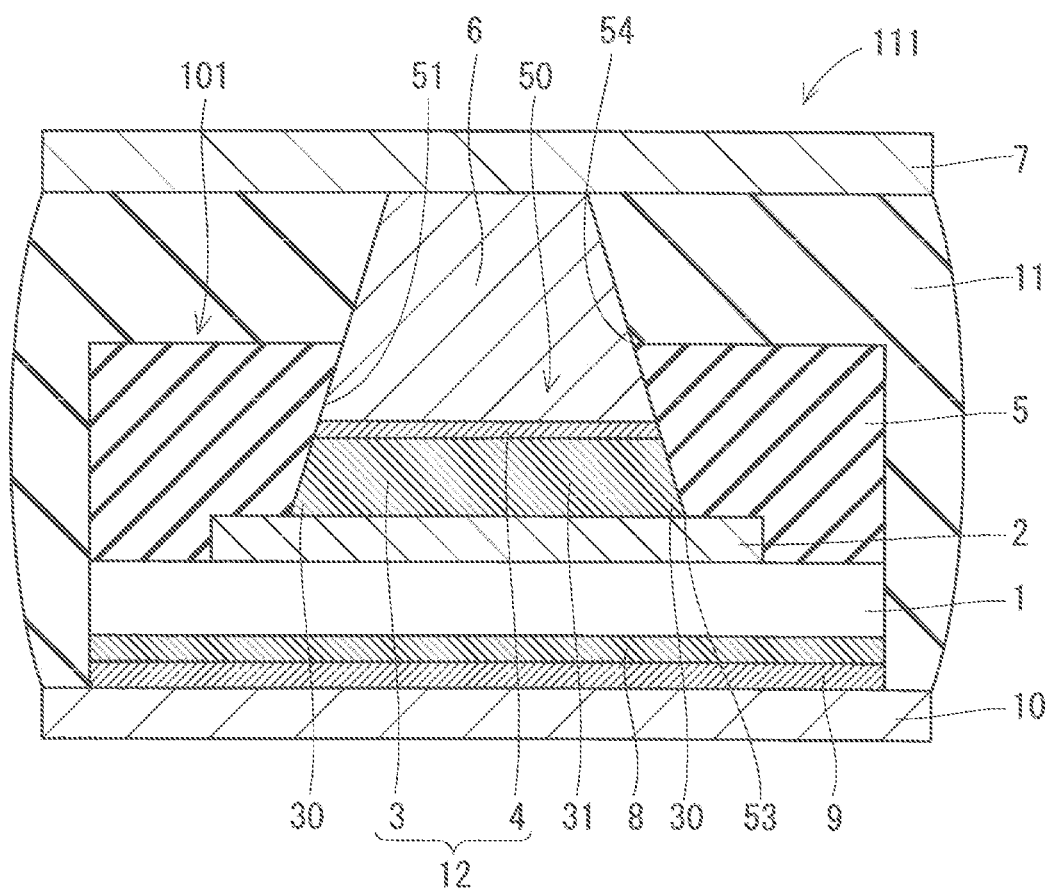
FIG. 23 is a cross-sectional view illustrating one example of the structure of a semiconductor device.
Figure 24:
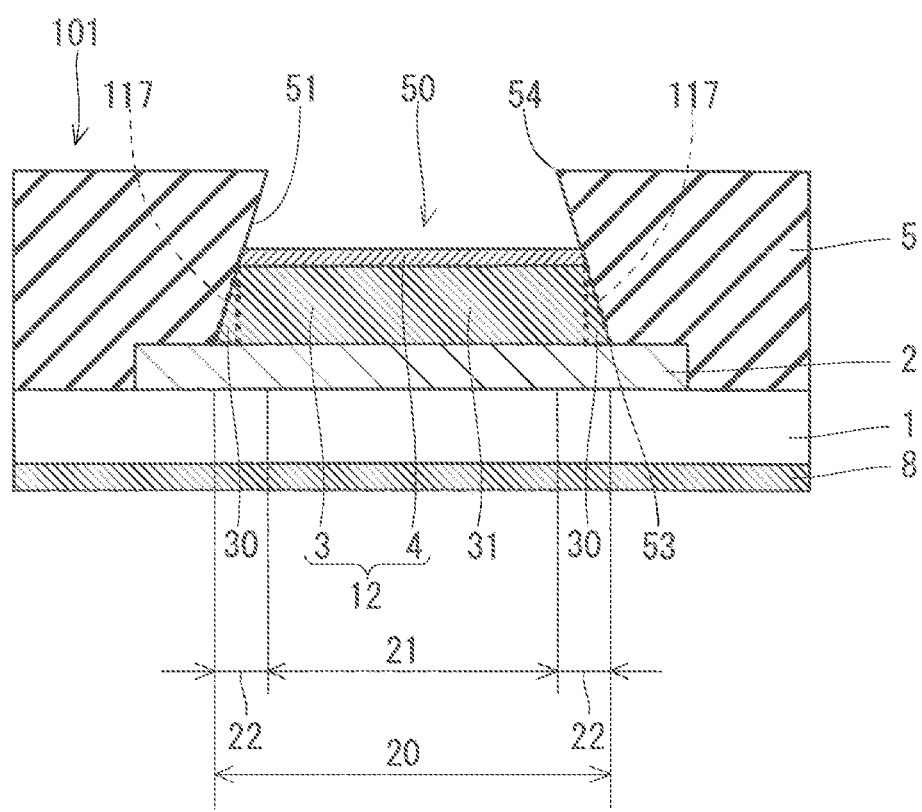
FIG. 24 is a cross-sectional view illustrating one example of the structure of a semiconductor device.

FIG. 23 is a cross-sectional view illustrating one example of the structure of a semiconductor device 111 according to a second preferred embodiment. FIG. 24 is a cross-sectional view illustrating one example of the structure of a semiconductor device 101 included in the semiconductor device 111. The semiconductor device 111 includes the semiconductor device 101 instead of the semiconductor device 100 in the semiconductor device 110. The shape of the opening 50 in the semiconductor device 101 is different from that of the opening 50 in the semiconductor device 100.

As illustrated in FIGS. 23 and 24, the protective film 5 of the semiconductor device 101 has the opening 50 whose inner wall 51 has a reverse tapered shape such that its diameter increases from the second opening-edge 54 toward the First opening-edge 53. Thus, the solder-joining metal film 3 disposed in the opening 50 has a forward tapered shape when viewed from its back surface toward its upper surface. The solder-joining metal film 3 in the opening 50 has such a diameter (i.e., a dimension in a direction perpendicular to its thickness direction) as to gradually increase from its back surface toward its upper surface.

FIG. 4 shows a portion defined by a broken line 117. In this example, this portion is the first portion 30 of the solder-joining metal film 3 that does not overlap the oxidation-inhibiting metal film 4 in plan view when the solder-joining metal film 3 and the oxidation-inhibiting metal film 4 are viewed from the oxidation-inhibiting metal film 4. This portion is the perimeter of the solder-joining metal film 3. The oxidation-inhibiting metal film 4 is not located on the perimeter. Accordingly, the wider layer 6, when formed onto the oxidation-inhibiting metal film 4, is not located above the perimeter of the solder-joining metal film 3, as illustrated in FIG. 23.

As such, the preferred embodiment, in which, like the first preferred embodiment, the solder layer 6 is not located above the perimeter of the solder-joining metal film 3, enables the anode electrode 2 to be less affected by a stress resulting from the difference in thermal expansion coefficient between the solder-joining metal film 3 and the solder layer 6. This reduces the possibility of cracking in the anode electrode 2 or the detachment of the anode electrode 2 from the semiconductor substrate 1. Consequently, the durability of the semiconductor device 111 improves.

The protective film 5 in the preferred embodiment has the opening 50 whose inner wall 51 has a reverse tapered shape. This facilitates covering of the first portion 30 of the solder-joining metal film 3 with the protective film 5.

Figure 25:
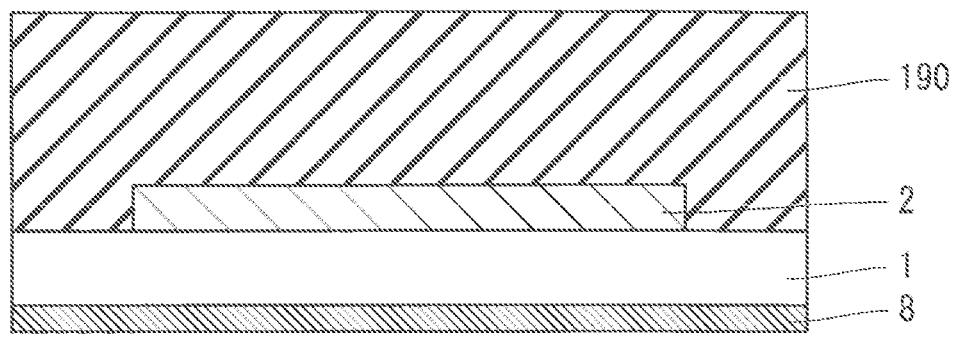
FIGS. 25 to 27 are cross-sectional views illustrating process steps for manufacturing the semiconductor device.
Figure 26:
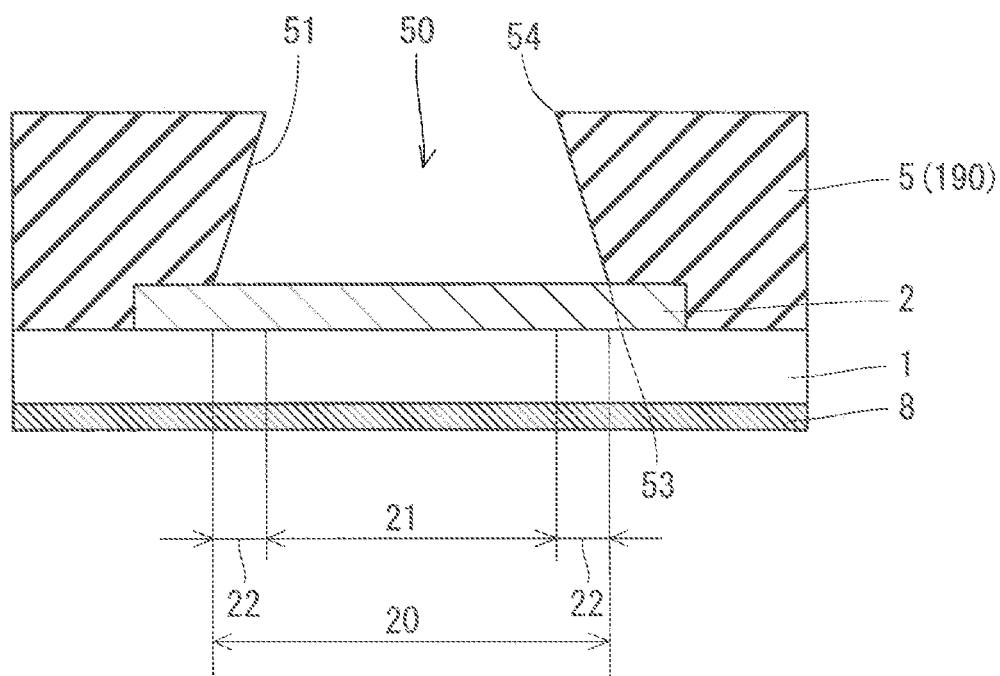
Figure 27:
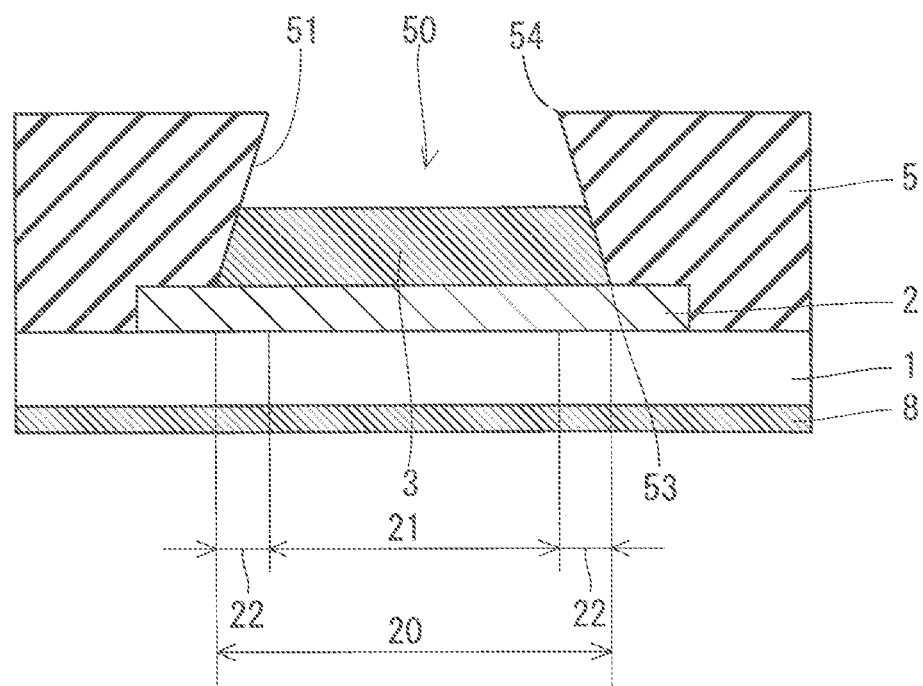

The following describes one example of a method for manufacturing the semiconductor device 111. FIGS. 25 to 27 are cross-sectional views illustrating one example of process steps for manufacturing the semiconductor device 111. As illustrated in FIG. 25, an insulating film 190 to be the protective film 5 is formed onto the structure illustrated in FIG. 7 after the structure in FIG. 7 is obtained. Next, as illustrated in FIG. 26, the insulating film 190 is partly removed through photolithography to form the protective film 5 having the opening 50 that partly exposes the anode electrode 2 onto the semiconductor substrate 1 and the anode electrode 2. The opening 50 whose inner wall 51 has a reverse tapered shape can be formed through photolithography. Next, as illustrated in FIG. 27, the solder-joining metal film 3 is formed onto the exposed portion 20 of the anode electrode 2 through, for instance, plating. The subsequent process steps are similar to those in the first preferred embodiment.

In this way, the solder-joining metal film 3 and the oxidation-inhibiting metal film 4 in this preferred embodiment are formed, through plating, in the opening 50 whose inner wall 51 has a reverse tapered shape. This easily prevents the perimeter of the soldering metal film 3 from being covered with the oxidation-inhibiting metal film 4. Consequently, the durability of the semiconductor device 111 improves.

Third Preferred Embodiment

Figure 28:
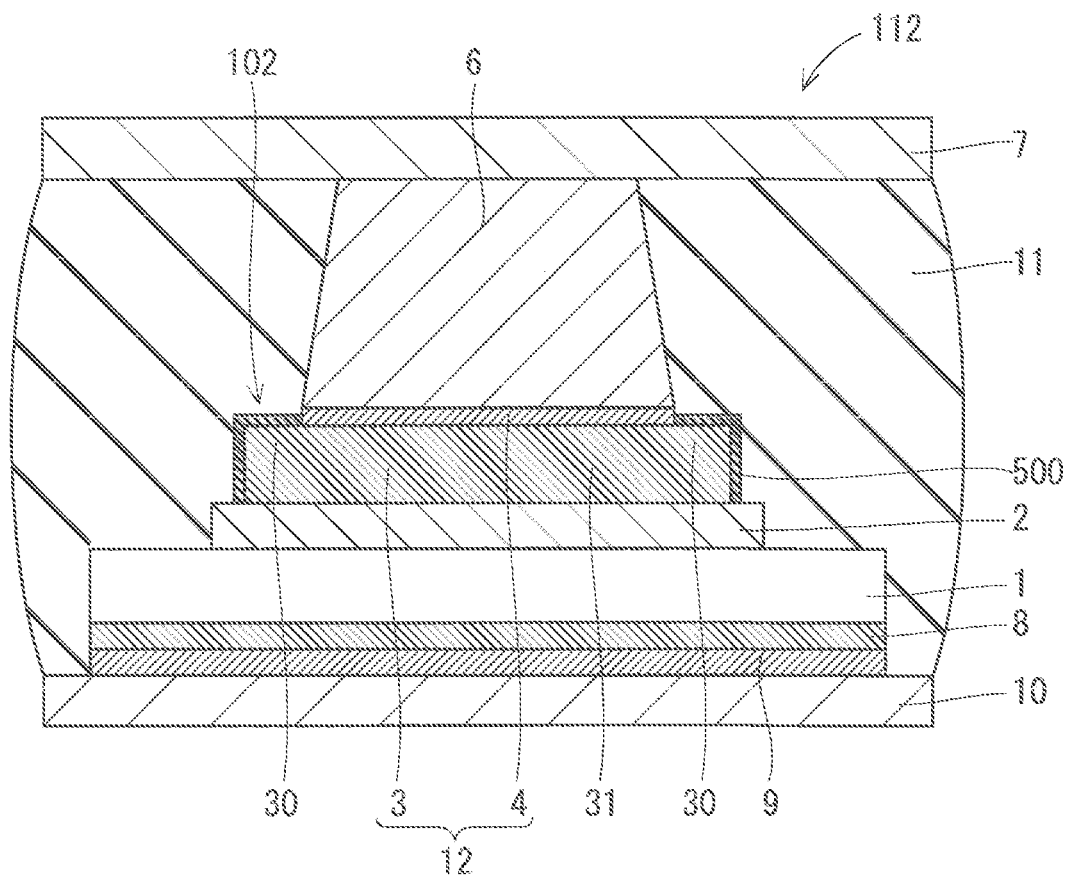
FIG. 28 is a cross-sectional view illustrating one example of the structure of a semiconductor device.
Figure 29:
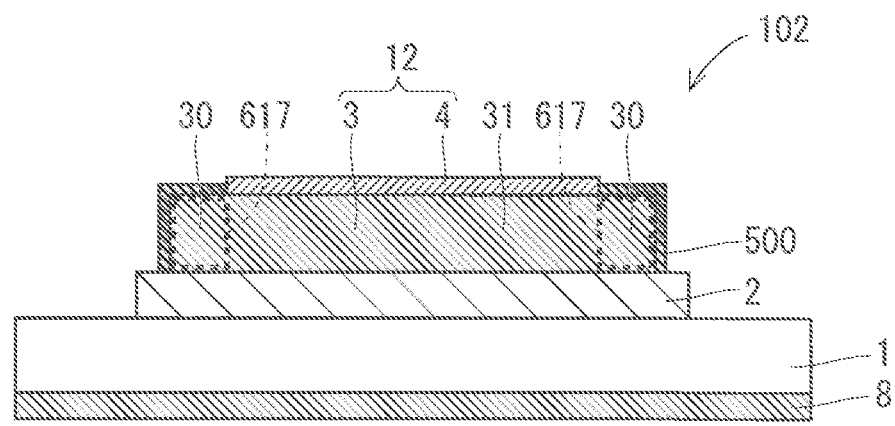
FIG. 29 is a cross-sectional view illustrating one example of the structure of a semiconductor device.

FIG. 28 is a cross-sectional view illustrating one example of the structure of a semiconductor device 112 according to a third preferred embodiment. FIG. 29 is a cross-sectional view illustrating one example of the structure of a semiconductor device 102 included in the semiconductor device 112. The semiconductor device 112 includes the semiconductor device 102 instead of the semiconductor device 100 in the semiconductor device 110. The semiconductor device 102 includes an insulating film 500 instead of the protective film 5 in the semiconductor device 100.

As illustrated in FIGS. 28 and 29, the solder-joining metal film 3 in the semiconductor device 102 is disposed on the anode electrode 2. In addition, the oxidation-inhibiting metal film 4 is disposed on part of the upper surface of the solder-joining metal film 3. In addition, the insulating film 500 is disposed on a portion of the solder-joining metal film exposed from the oxidation-inhibiting metal film 4. The insulating film 500 has low solderability and is formed of, for instance, an oxide film. The insulating film 500 is formed of, for instance, an oxide of the same meal material as the solder-joining metal film 3.

FIG. 29 shows a portion defined by a broken line 617. In this example, this portion is the first portion 30 of the solder-joining metal film 3 that does not overlap the oxidation-inhibiting metal film 4 in plan view when the solder-joining metal film 3 and the oxidation-inhibiting metal film 4 are viewed from the oxidation-inhibiting metal film 4. This portion is the perimeter of the solder-joining metal film 3. The oxidation-inhibiting metal film 4 is not located on the perimeter. Accordingly, the solder layer 6, when formed onto the oxidation-inhibiting metal film 4, is not located above the perimeter of the solder-joining metal film 3, as illustrated in FIG. 28. The first portion 30 of the solder-joining metal film 3 is covered with the insulating film 500.

As such, the preferred embodiment, in which, like the first and second preferred embodiments, the solder layer 6 is not located above the perimeter of the solder-joining metal film 3, enables the anode electrode 2 to be less affected by a stress resulting from the difference in thermal expansion coefficient between the solder-joining metal film and the solder layer 6. This reduces the possibility of cracking in the anode electrode 2 or the detachment of the anode electrode 2 from the semiconductor substrate 1. Consequently, the durability of the semiconductor device 112 improves.

In this example, in which the insulating film 500 is formed of an oxide of the same material as the solder-joining metal film 3, oxidizing part of the solder-joining metal film 3 easily forms the insulating film 500.

Figure 30:
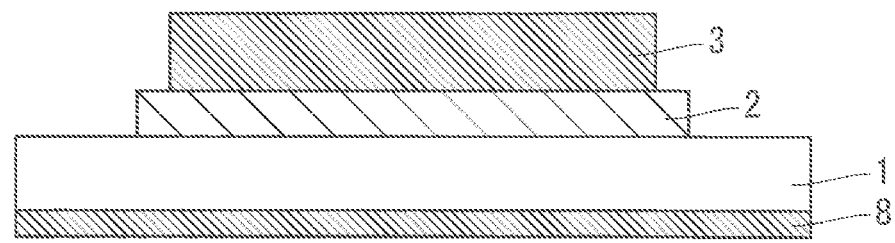
FIGS. 30 and 31 are cross-sectional views illustrating process steps for manufacturing the semiconductor device.
Figure 31:
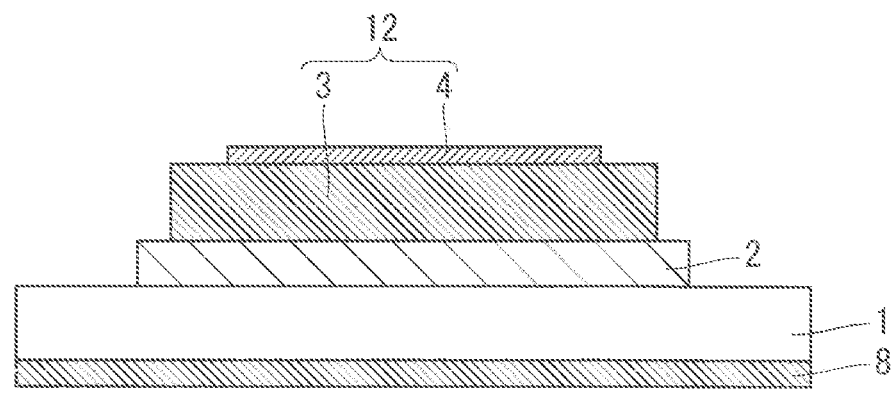

The following describes a method for manufacturing the semiconductor device 112. FIGS. 30 and 31 are cross-sectional views illustrating one example of process steps for manufacturing the semiconductor device 112. As illustrated in FIG. 30, the solder-joining metal film 3 is formed onto the anode electrode 2 after the structure in FIG. 7 is obtained. Next, as illustrated in FIG. 31, the oxidation-inhibiting metal film 4 is formed onto part of the upper surface of the solder-joining metal film 3. To be specific, the oxidation-inhibiting metal film 4 is formed onto the upper surface of the solder-joining metal film 3 except its perimeter. The solder-joining metal film 3 and the oxidation-inhibiting metal film 4 are formed by forming a metal film through plating, sputtering, or vapor deposition, followed by patterning the metal film through photolithography. Next, the solder-joining metal film 3 undergoes oxidation in a portion exposed from the oxidation-inhibiting metal film 4. This forms the insulating film 500 in this exposed portion, thus obtaining the structure illustrated in FIG. 29. The subsequent process steps are similar to those in the first preferred embodiment.

In the preferred embodiment, the soldering metal film 3 undergoes oxidation in the portion exposed from the oxidation-preventing metal film 4, as described above. This easily forms the insulating film 500 that covers the exposed portion.

The semiconductor devices 100 to 102, although being diodes in the aforementioned examples, may be any device other than diodes. For instance, the semiconductor devices 100 to 102 may be power metal-oxide-semiconductor field-effect transistors (MOSFETs) or insulated-gate bipolar transistors (IGBTs). The present disclosure is applicable not only to power devices, but also to various semiconductor devices.

It is noted that in the present invention, the individual preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device comprising:
a semiconductor substrate;
an electrode on the semiconductor substrate;
a solder-joining metal film on the electrode;
an oxidation-inhibiting metal film on the solder-joining metal film;

an insulating film on the oxidation inhibiting metal film, the insulating film including an opening extending through in a thickness direction of the insulating film; and a solder layer on the oxidation-inhibiting metal film, wherein the solder-joining metal film includes a first portion that does not overlap the oxidation-inhibiting metal film in plan view when the solder-joining metal film and the oxidation-inhibiting metal film are viewed from the oxidation-inhibiting metal film, the insulating film covers the first portion in the plan view, and the solder-joining metal film and the oxidation-inhibiting metal film are located in the opening.

2. The semiconductor device according to claim 1, wherein
the insulating film is formed of an oxide made of a metal material identical to a metal material of the solder-joining metal film.

3. The semiconductor device according to claim 1, wherein
the opening includes an inner wall having a reverse stair shape, and
the inner wall includes a stair that covers the first portion.

4. The semiconductor device according to claim 1, wherein
the opening includes an inner wall having a reverse tapered shape.

5. A method for manufacturing the semiconductor device according to claim 1, the method comprising:
forming the solder-joining metal film;
forming the oxidation-inhibiting metal film onto part of an upper surface of the solder-joining metal film; and
forming the insulating film by oxidizing a portion of the solder-joining metal film exposed from the oxidation-inhibiting metal film.

6. A method for manufacturing the semiconductor device according to claim 1, the method comprising:
forming the solder-joining metal film through plating; and
forming the oxidation-inhibiting metal film onto the solder-joining metal film through plating.

7. The method according to claim 6, further comprising,
before forming the solder-joining metal film, forming an insulating film that includes an opening that exposes the electrode onto the semiconductor substrate, wherein
the opening includes a first opening-edge adjacent to the electrode, and a second opening-edge opposite to the first opening-edge,
the insulating film is formed in such a manner that an exposed portion of the electrode exposed from the opening includes a second portion and a third portion, the second portion not overlapping the insulating film in plan view when viewed from the second opening-edge, the third portion overlapping the insulating film in plan view when viewed from the second opening-edge, and
the solder-joining metal film is formed onto the second and third portions through plating.

8. The method according to claim 7, wherein
the insulating film is formed in such a manner that the opening includes an inner wall having a reverse tapered shape.

9. The method according to claim 7, wherein
the insulating film is formed in such a manner that the opening includes an inner wall of a reverse stair shape having a stair that faces the third portion with a gap interposed between the third portion and the stair, and
the solder-joining metal film is formed through plating so as to fill the gap.

10. The method according to claim 9, wherein
the insulating film is formed by depositing films of the same material a plurality of times.

11. The method according to claim 9, wherein
forming the solder-joining metal film includes
forming a film to be the insulating film onto the electrode,
exposing the electrode by partly removing the film, and
after exposing the electrode, forming the insulating film by partly removing the electrode.

12. The method according to claim 11, wherein
the electrode, after being exposed, is partly removed through isotropic wet etching.

13. The method according to claim 9, wherein
forming the solder-joining metal film includes
forming a first film onto the electrode,
forming a second film to be the insulating film onto the first film,
exposing the first film by partly removing the second film, and
after exposing the first film, forming the insulating film by removing the first film.

14. The method according to claim 13, wherein
the first film is a metal film made of a metal material different from a metal material of the electrode.

15. The method according to claim 14, wherein
the first film, after being exposed, is removed through isotropic wet etching.

16. The method according to claim 13, wherein
the first film is an oxide film.

17. The method according to claim 16, wherein
the first film, after being exposed, is removed through isotropic wet etching.

* * * * *